(12) United States Patent
Kuo et al.

(10) Patent No.: US 11,271,090 B2
(45) Date of Patent: Mar. 8, 2022

(54) METHOD FOR FABRICATING SEMICONDUCTOR DEVICE

(71) Applicant: UNITED MICROELECTRONICS CORP., Hsin-Chu (TW)

(72) Inventors: Chia-Ming Kuo, Kaohsiung (TW); Fu-Jung Chuang, Kaohsiung (TW); Po-Jen Chuang, Kaohsiung (TW); Chia-Wei Chang, Tainan (TW); Guan-Wei Huang, Tainan (TW); Chia-Yuan Chang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/867,579

(22) Filed: May 6, 2020

(65) Prior Publication Data
US 2021/0320187 A1  Oct. 14, 2021

(30) Foreign Application Priority Data
Apr. 10, 2020 (CN) .......................... 202010278005.6

(51) Int. Cl.
| H01L 29/66 | (2006.01) |
| H01L 21/28 | (2006.01) |
| H01L 29/78 | (2006.01) |
| H01L 21/3105 | (2006.01) |
| H01L 21/265 | (2006.01) |

(52) U.S. Cl.
CPC .... *H01L 29/6659* (2013.01); *H01L 21/28176* (2013.01); *H01L 21/3105* (2013.01); *H01L 29/785* (2013.01); *H01L 29/7833* (2013.01); *H01L 21/2652* (2013.01)

(58) Field of Classification Search
CPC ........ H01L 21/02323; H01L 21/02326; H01L 21/3105; H01L 21/31058; H01L 21/32105; H01L 21/02142; H01L 21/02126; H01L 21/0214; H01L 21/02164; H01L 21/28176; H01L 21/2652; H01L 29/6659; H01L 29/7833
See application file for complete search history.

(56) References Cited

U.S. PATENT DOCUMENTS

| 5,500,379 A | * | 3/1996 | Odake ............. H01L 21/823807 438/217 |
| 6,288,432 B1 | | 9/2001 | Hause et al. |
| 9,806,078 B1 | * | 10/2017 | Xie ..................... H01L 29/6653 |
| 10,079,290 B2 | * | 9/2018 | Hung ............... H01L 21/823431 |
| 10,249,730 B1 | * | 4/2019 | Belyansky .......... H01L 29/7831 |

* cited by examiner

*Primary Examiner* — Jose R Diaz
(74) *Attorney, Agent, or Firm* — Winston Hsu

(57) ABSTRACT

A method for fabricating a semiconductor device includes the steps of: providing a substrate having a NMOS region and a PMOS region; forming a first gate structure on the NMOS region and a second gate structure on the PMOS region; forming a seal layer on the first gate structure and the second gate structure; forming a first lightly doped drain (LDD) adjacent to the first gate structure; forming a second LDD adjacent to the second gate structure; and performing a soak anneal process to boost an oxygen concentration of the seal layer for reaching a saturation level.

10 Claims, 5 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly to a method of using a soak anneal process to increase an oxygen concentration of a seal layer to a saturation level.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor particularly when ion implantation processes were conducted to implant dopants into the substrate for forming lightly doped drains (LDDs), the concentration of implanted dopants is often disturbed due to various factors and resulting in issue such as Vt roll-off and affecting the performance of the device. Hence, how to resolve this issue has become an important task in this field.

SUMMARY OF THE INVENTION

According to an embodiment of the present invention, a method for fabricating a semiconductor device includes the steps of: providing a substrate having a NMOS region and a PMOS region; forming a first gate structure on the NMOS region and a second gate structure on the PMOS region; forming a seal layer on the first gate structure and the second gate structure; forming a first lightly doped drain (LDD) adjacent to the first gate structure; forming a second LDD adjacent to the second gate structure; and performing a soak anneal process to boost an oxygen concentration of the seal layer for reaching a saturation level.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
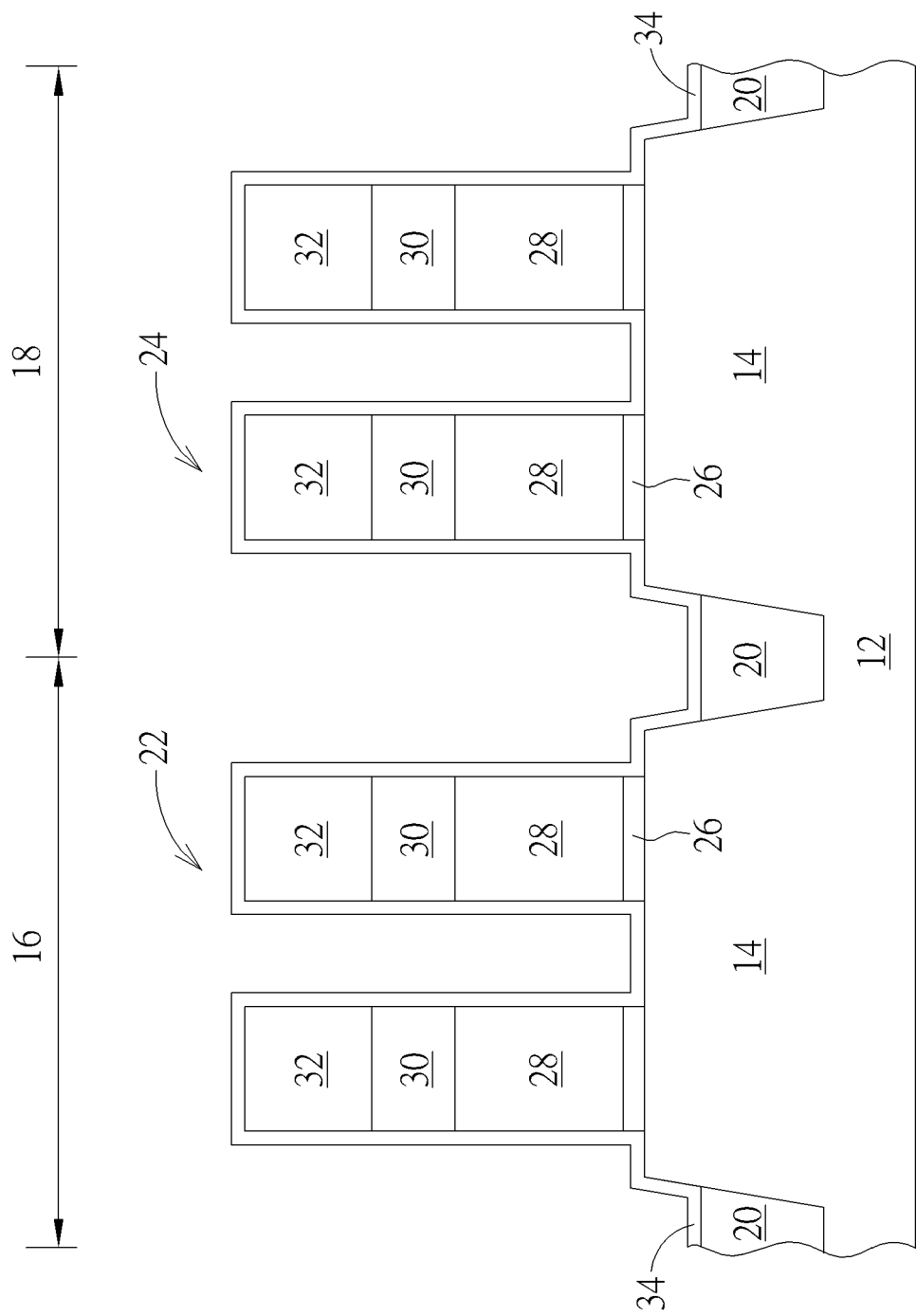
FIGS. 1-5 illustrate a method for fabricating semiconductor device according to an embodiment of the present invention.

Referring to FIGS. 1-5, FIGS. 1-5 illustrate a method for fabricating semiconductor device according to an embodiment of the present invention. As shown in FIG. 1, a substrate 12 such as a silicon substrate or silicon-on-insulator (SOI) substrate is provided and transistor regions such as a NMOS region 16 and a PMOS region 18 are defined on the substrate 12. At least a fin-shaped structure 14 and an insulating layer (not shown) are formed on the substrate 12, in which the bottom portion of the fin-shaped structure 14 is surrounded by the insulating layer made of dielectric material such as silicon oxide to form a shallow trench isolation (STI) 20. It should be noted that even though this embodiment pertains to the fabrication of a non-planar FET device such as FinFET device, it would also be desirable to apply the content of the following process to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, gate structures 22, 24 or dummy gate are formed on the substrate 12. In this embodiment, the formation of the gate structures 22, 24 could be accomplished by a gate first process, a high-k first approach from gate last process, or a high-k last approach from gate last process. Since this embodiment pertains to a high-k last approach, a gate dielectric layer 26 or interfacial layer, a gate material layer 28, and a selective hard mask such as a hard mask made of hard mask 30 and hard mask 32 could be formed sequentially on the substrate 12, and a pattern transfer process is then conducted by using a patterned resist (not shown) as mask to remove part of the hard masks 32, 30, part of the gate material layer 28, and part of the gate dielectric layer 26 through single or multiple etching processes. After stripping the patterned resist, gate structures 22, 24 each made of a patterned gate dielectric layer 26, a patterned material layer 28, and patterned hard masks 30, 32 are formed on the NMOS region 16 and PMOS region 18 respectively.

Next, a seal layer 34 is formed on the gate structures 22, 24, on the NMOS region 16 and PMOS region 18 to cover the surface of the substrate 12 and even the STI 20. In this embodiment, the seal layer 34 is preferably made of nitrides such as silicon nitride (SiN) having low-k dielectric constant or most preferably silicon oxycarbonitride (SiOCN). If the seal layer 34 were made of SiOCN the composition thereof preferably includes 32% of silicon atoms, 40% of oxygen atoms, 8% of carbon atoms, and 20% of nitrogen atoms.

Figure 2:
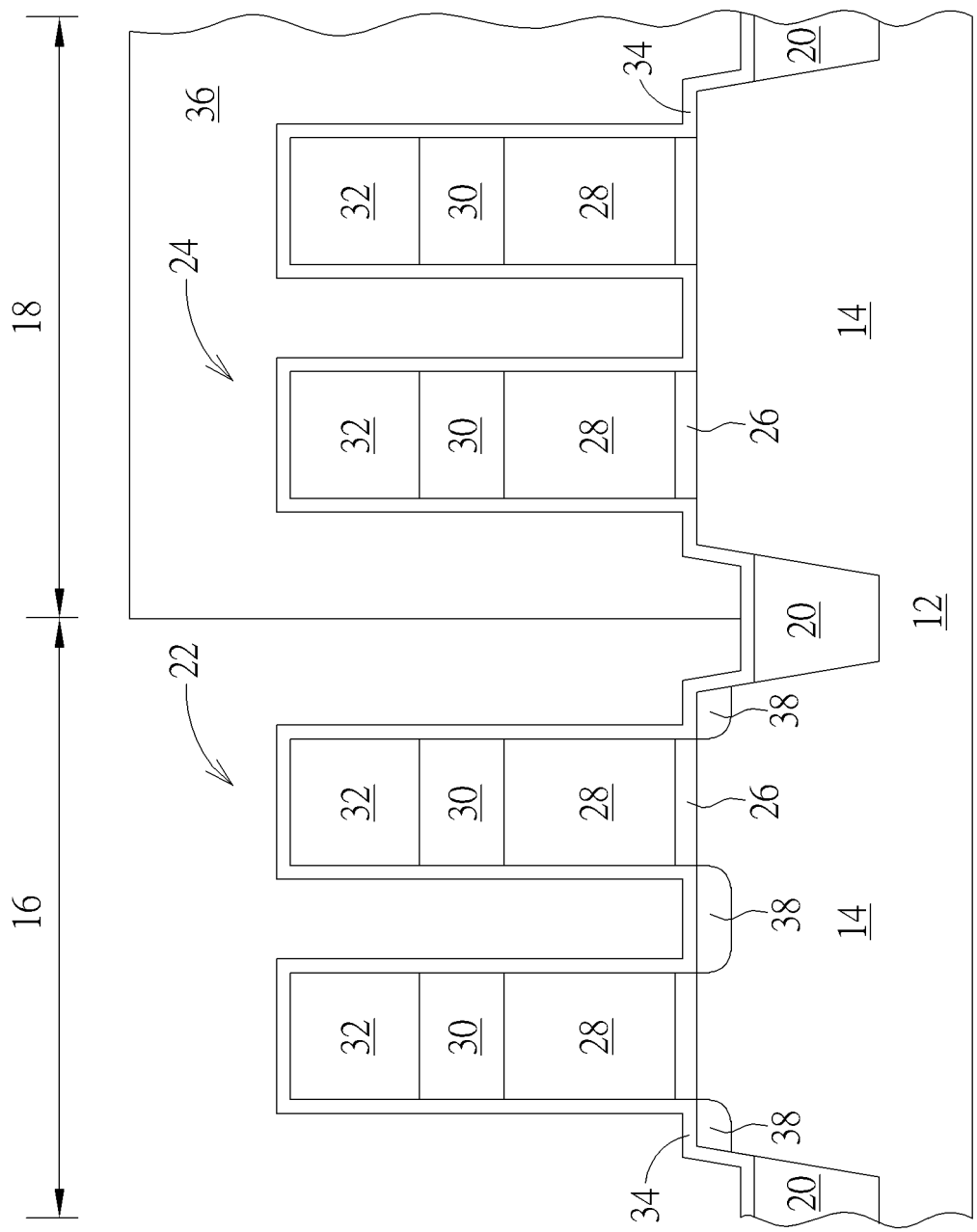

Next, as shown in FIG. 2, a patterned mask 36 such as a patterned resist is formed on the gate structures 24 and fin-shaped structure 14 on the PMOS region 18, and an ion implantation process is conducted to implant n-type dopants through the seal layer 34 on the NMOS region 16 and into the fin-shaped structure 14 adjacent to the gate structures 22 for forming one or more lightly doped drains (LDDs) 38.

Figure 3:
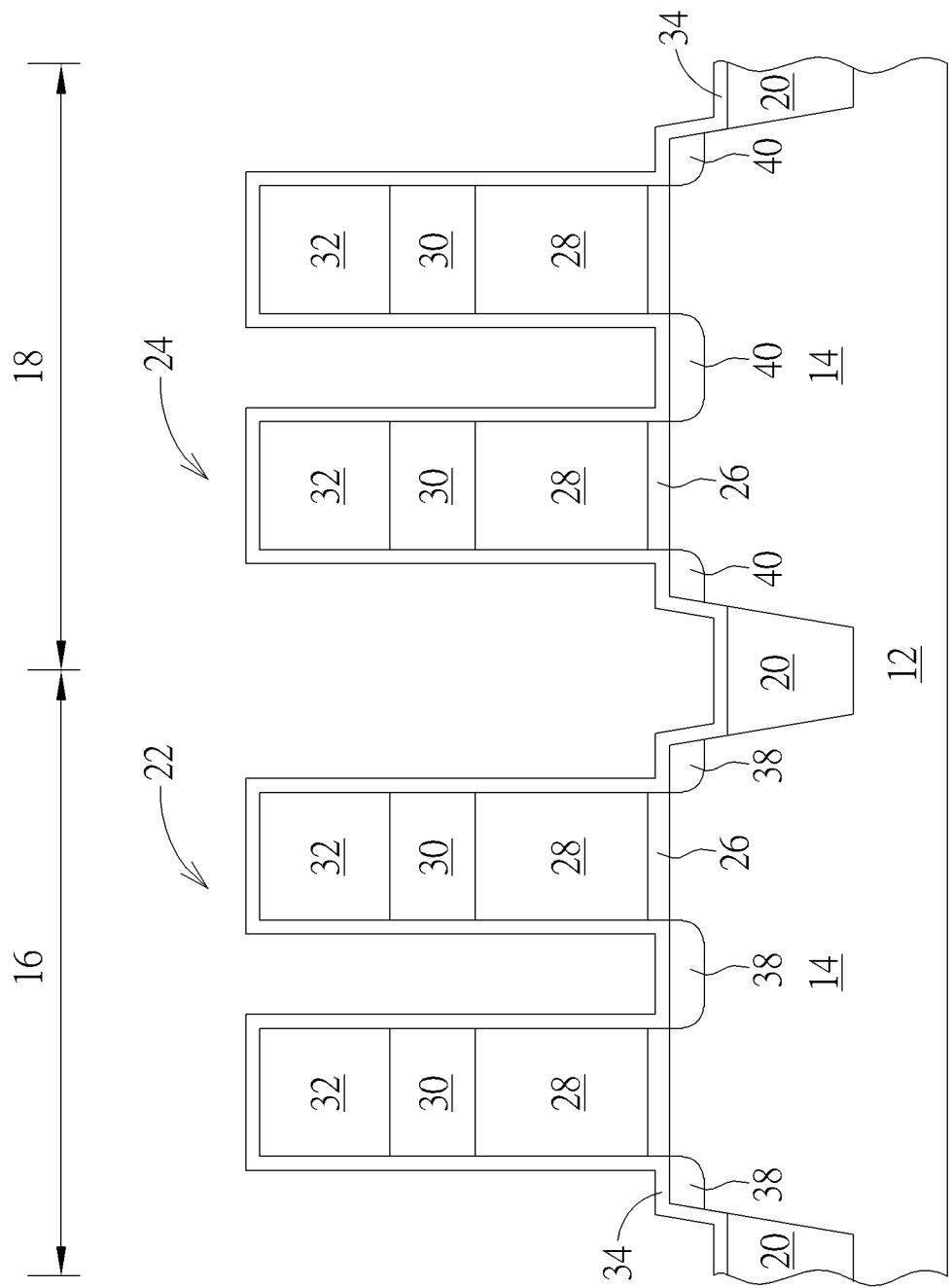

Next, as shown in FIG. 3, after stripping the patterned mask 36 on the PMOS region 18, another patterned mask (not shown) such as a patterned resist is formed on the gate structures 22 and fin-shaped structure 14 on the NMOS region 16, and an ion implantation process is conducted to implant p-type dopants through the seal layer 34 on the PMOS region 18 and into the fin-shaped structure 14 adjacent to the gate structures 24 for forming one or more LDDs 40. The patterned mask on the NMOS region 16 is stripped thereafter.

Figure 4:
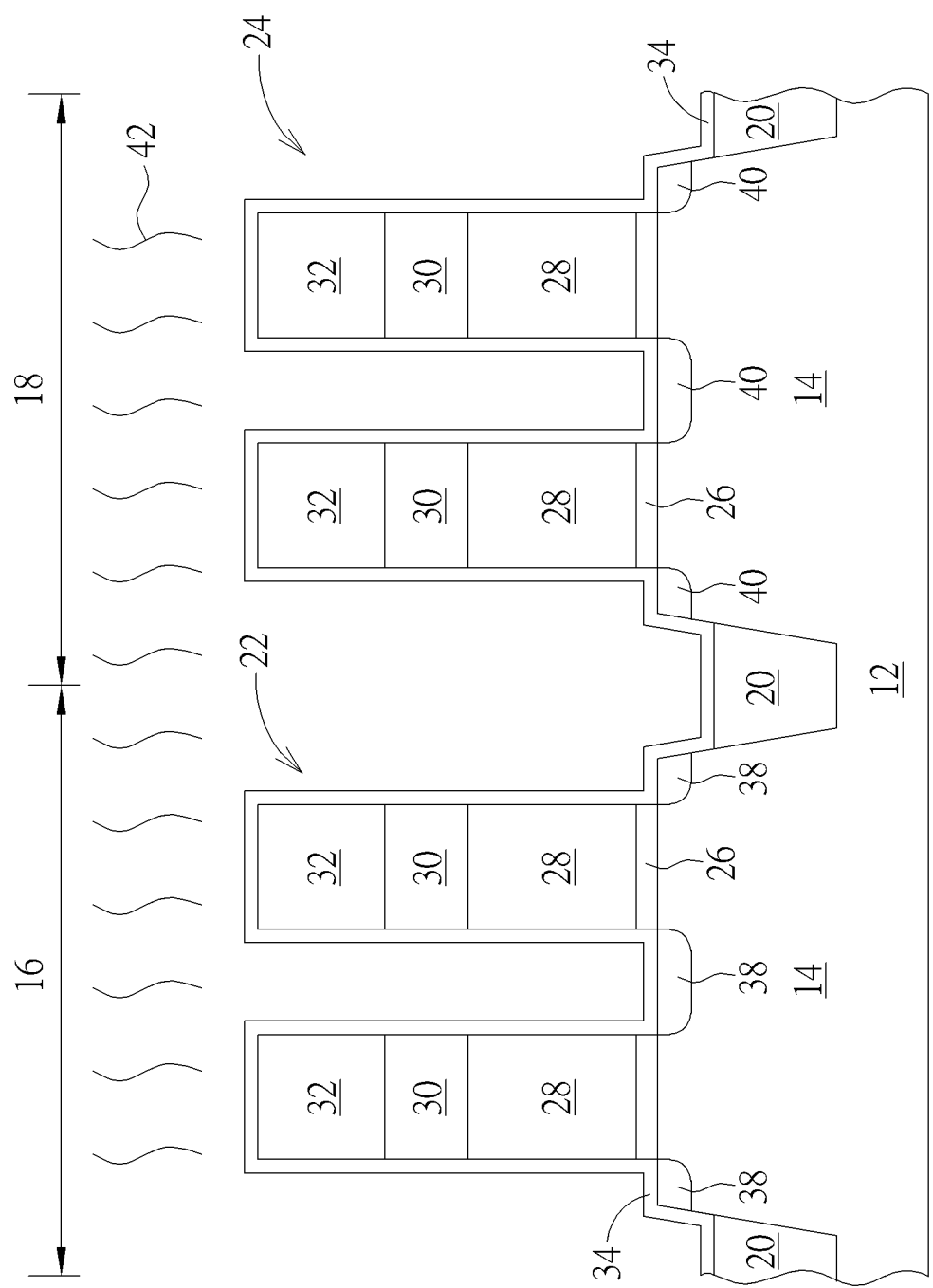

Next, as shown in FIG. 4, after forming the LDDs 38, 40 on the NMOS region 16 and PMOS region 18, a soak anneal process 42 is conducted to boost an oxygen concentration of the seal layer 34 to a saturation level. Specifically, the soak anneal process conducted at this stage preferably transforms the seal layer 34 made of SiOCN into silicon dioxide ($SiO_2$) by increasing the content of oxygen so that a single silicon atom now pairs with two oxygen atoms. For instance, 40% of oxygen content within the seal layer 34 is now boosted through the soak anneal process 42 to reach a saturation level of 60% to 62% or most preferably 61%.

It should be noted that even though the soak anneal process 42 is conducted through the injection of oxygen gas without the addition of any other gases to boost the oxygen content within the seal layer 34, according to other embodiment of the present invention it would also be desirable to not only injection oxygen gas but also other gas or gases such as nitrogen gas to conduct the soak anneal process 42, which is also within the scope of the present invention. Preferably, duration of the soak anneal process is between 60 minutes to 80 minutes or most preferably 70 minutes and temperature of the soak anneal process is between 700° C. to 1000° C., but not limited thereto.

Figure 5:
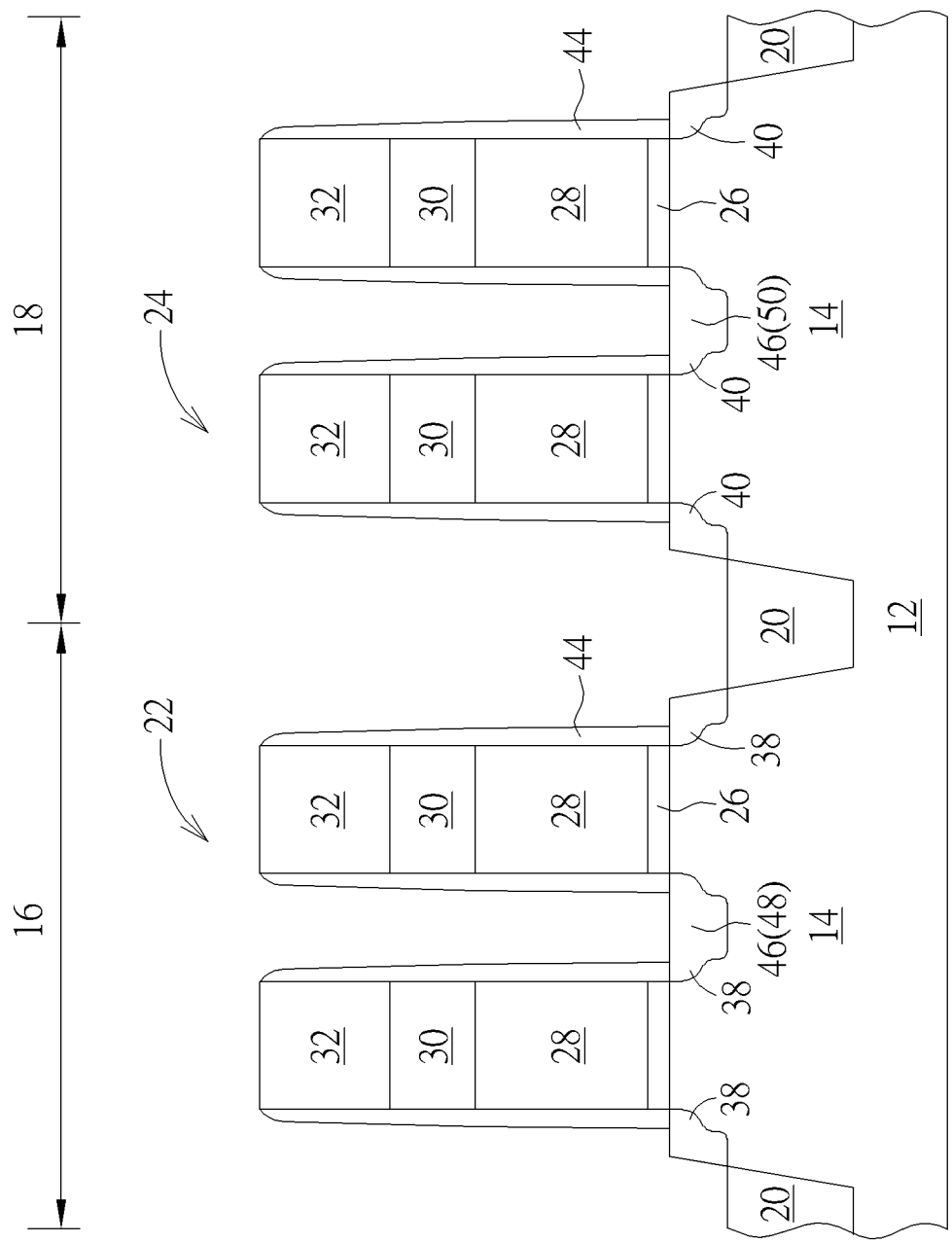

Next, as shown in FIG. 5, a spike anneal process could be conducted after the soak anneal process 42 to make minor adjustments to the entire device, in which the spike anneal process could be conducted under a temperature of approximately 1080° C. for 10 seconds. Next, one or more etching process could be conducted to remove part of the seal layer 34 on the NMOS region 16 and PMOS region 18 for forming a spacer 44 adjacent to each of the gate structures 22, 24, part of the fin-shaped structures 14 adjacent to the spacers 44 on NMOS region 16 and PMOS region 18 is removed to form recesses (not shown), and a selective epitaxial growth (SEG) process is conducted to form epitaxial layers 46 in each of the recesses serving as source/drain regions 48, 50 on the NMOS region 16 and PMOS region 18. In this embodiment, the epitaxial layers 46 could include different material depending on type of MOS transistor being fabricated. For instance, the epitaxial layers 46 on the PMOS region 18 could include SiGe, SiGeB, or SiGeSn and the epitaxial layer 46 on the NMOS region 16 could be made of material including but not limited to for example SiC, SiCP, or SiP.

Next, elements such as contact etch stop layer (CESL) could be formed on the gate structures 22, 24 on NMOS region 16 and PMOS region 18, an interlayer dielectric (ILD) layer could be formed on the surface of the CESL, a replacement metal gate (RMG) process could be conducted to transform the gate structures on each transistor region into metal gates, and a contact plug formation could be conducted to form contact plugs in the ILD layer and CESL for electrically connecting the source/drain regions 48, 50. This completes the fabrication of a semiconductor device according to an embodiment of the present invention.

Typically in current FinFET fabrication particularly when ion implantation processes were conducted to implant dopants into the substrate for forming lightly doped drains (LDDs), the concentration of implanted dopants is often shifted during waiting time or Q-time between different fabrication steps and resulting in issue such as Vt roll-off. To resolve this issue the present invention preferably conducts a soak anneal process after forming the LDDs to boost the oxygen concentration within the seal layer for reaching a saturation level so that the seal layer made of SiOCN is eventually transformed into $SiO_2$. Upon experimental verification this approach could improve the issue of Vt roll-off significantly thereby improving the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   forming a first gate structure on a substrate;
   forming a seal layer on the first gate structure;
   forming a first lightly doped drain (LDD) adjacent to the first gate structure;
   performing a soak anneal process to boost an oxygen concentration of the seal layer for reaching a saturation level;
   performing a spike anneal process after performing the soak anneal process; and
   forming a first source/drain region adjacent to the first gate structure after performing the spike anneal process.

2. The method of claim 1, wherein the substrate comprises a NMOS region and a PMOS region, the method comprising:
   forming the first gate structure on the NMOS region and a second gate structure on the PMOS region;
   forming the first LDD adjacent to the first gate structure;
   forming a second LDD adjacent to the second gate structure; and
   performing the soak anneal process.

3. The method of claim 2, further comprising:
   performing the spike anneal process after performing the soak anneal process;
   forming the first source/drain region adjacent to the first gate structure; and
   forming a second source/drain region adjacent to the second gate structure.

4. The method of claim 1, wherein the seal layer comprises silicon oxycarbonitride (SiOCN).

5. The method of claim 1, further comprising performing the soak anneal process to transform the seal layer comprising SiOCN into silicon oxide ($SiO_2$).

6. The method of claim 1, wherein the soak anneal process comprises nitrogen gas ($N_2$) and oxygen gas ($O_2$).

7. The method of claim 1, wherein the soak anneal process comprises oxygen gas ($O_2$).

8. The method of claim 1, wherein a duration of the soak anneal process is between 60 minutes to 80 minutes.

9. The method of claim 1, wherein a temperature of the soak anneal process is between 700° C. to 1000° C.

10. The method of claim 1, wherein the oxygen concentration of the seal layer is between 60% to 62%.

* * * * *